United States Patent
Hoke

(10) Patent No.: US 8,823,146 B1
(45) Date of Patent: *Sep. 2, 2014

(54) SEMICONDUCTOR STRUCTURE HAVING SILICON DEVICES, COLUMN III-NITRIDE DEVICES, AND COLUMN III-NON-NITRIDE OR COLUMN II-VI DEVICES

(71) Applicant: Raytheon Company, Waltham, MA (US)

(72) Inventor: William E. Hoke, Wayland, MA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/770,197

(22) Filed: Feb. 19, 2013

(51) Int. Cl.
  *H01L 29/04* (2006.01)
  *H01L 31/036* (2006.01)

(52) U.S. Cl.
  CPC .................................. *H01L 29/045* (2013.01)
  USPC ............. 257/628; 257/289; 257/204; 257/69; 257/E21.006; 257/E21.126; 257/E21.127; 257/E21.128; 257/E21.129; 257/E21.172; 257/E21.213; 257/E21.217; 257/E21.561; 257/E21.562; 257/E21.632

(58) Field of Classification Search
  USPC ........... 257/628, 69, 204, 289, 200, 201, 288, 257/347, 631, 255, 627, E21.006, E21.062, 257/E21.126, E21.127, E21.128, E21.129, 257/E21.172, E21.213, E21.217, E21.561, 257/E21.562, E21.632
  See application file for complete search history.

(56) References Cited

U.S. PATENT DOCUMENTS

| | | | | |
|---|---|---|---|---|
| 5,373,171 | A * | 12/1994 | Imai et al. | 257/77 |
| 5,766,783 | A * | 6/1998 | Utsumi et al. | 428/698 |
| 5,903,015 | A * | 5/1999 | Shiomi et al. | 257/77 |
| 7,368,334 | B2 * | 5/2008 | Yeo et al. | 438/150 |
| 8,212,294 | B2 * | 7/2012 | Hoke et al. | 257/255 |
| 2008/0153267 | A1 | 6/2008 | Clavelier et al. | |
| 2009/0291523 | A1 | 11/2009 | Du et al. | |

(Continued)

FOREIGN PATENT DOCUMENTS

| | | |
|---|---|---|
| GB | 2 263 708 A | 1/1993 |
| WO | WO 2009/054804 A1 | 4/2009 |
| WO | WO 2011/094190 A1 | 8/2011 |
| WO | WO 2013/048693 A1 | 4/2013 |

OTHER PUBLICATIONS

T.E.Kazior, R. Chelakara, W. Hoke, J. Bettencourt, T. Palacios. H.E. Lee, High Performance Miced Signal and RF Circuits enabled by the Direct Monolithic Heterogeneous Integration of GaN HEMTs and Si CMOS on a Silicon Substrate, 2011 IEEE Compound Semiconductor IC Symposium (CSICS) Technical Digest, Waikoloa, Hawaii, Oct. 16-19, 2011, pp. 1-4.

(Continued)

*Primary Examiner* — David Nhu
(74) *Attorney, Agent, or Firm* — Daly, Crowley, Mofford & Durkee, LLP

(57) ABSTRACT

A semiconductor structure having a silicon substrate having a <111> crystallographic orientation, an insulating layer disposed over a first portion of the silicon substrate, a silicon layer having a <100> orientation disposed over the insulating layer, and a non-nitride column III-V semiconductor layer or column II-VI semiconductor layer having the same <111> crystallographic orientation as the silicon substrate, the non-nitride column III-V semiconductor layer or column II-VI semiconductor layer being in direct contact with a second portion of the silicon substrate. A column III-nitride is disposed on the surface of the third portion of the substrate.

14 Claims, 1 Drawing Sheet

(56) References Cited

U.S. PATENT DOCUMENTS

2010/0212729 A1 8/2010 Hsu
2011/0304021 A1 12/2011 Wann et al.
2012/0270378 A1 10/2012 Kittler et al.

OTHER PUBLICATIONS

W.E. Hoke, R.V. Chelakara, J.P. Bettencourt, T.E. Kazior, J.R. Laroche, T.D. Kennedy, J.J. Mosca, A. Torabari, and A.J. Kerr, Monolithic Integration of Silicon COS and GaN Transistors in a Current Mirror Circuit, Mar./Apr. 2012, J. Vac. Sci. Technol. B. 30(2) pp. 1-6.
Notification of Transmittal of The Internationl Search Report and The Written Opinion of the International Searching Authority, or the Declaration, PCT/US2014/010397, Mar. 25, 2014, 1 page.
International Search Report, PCT/US2014/010397, Mar. 25, 2014, 4 pages.
Written Opinion of the International Searching Authority, PCT/US2014/010397, Mar. 25, 2014, 8 pages.
T.E. Kazior, J.R. Laroche, D. Lubyshev, J.M. Fastenau, W.K. Liu, M. Urteaga, J. Bergman, M.J. Choe, T. Bulsara, E.A. Fitzgerald, D. Smith, D. Clark, R. Thompson, C. Drazek, N. Daval, L. Benaissa, E. Augendre, A High Performance Differential Amplifier Through the Direct Monolithic Integration of InP HBTs and Si CMOS on Silicon Substrates, Raytheon Integrated Defense Systems, Andover, Massachusetts, IEEE, 2009, pp. 113-1116.
S. Haffouz, F. Semond, J.A. Bardwell, T. Lester, H. Tang, Selectively grown AlGaN/GaN HEMTs on Si(111) substrates for integration with silicon microelectronics, Journal of Crystal Growth, 2009, pp. 2087-2090.

* cited by examiner

SEMICONDUCTOR STRUCTURE HAVING SILICON DEVICES, COLUMN III-NITRIDE DEVICES, AND COLUMN III-NON-NITRIDE OR COLUMN II-VI DEVICES

TECHNICAL FIELD

This disclosure relates generally to semiconductor structures and more particularly to semiconductor structures having silicon devices, column III-nitride devices, and column III-non-nitride or column II-VI devices.

BACKGROUND AND SUMMARY

As is known in the art, many electronics applications incorporate both silicon and column III-V circuits due to their unique performance characteristics. The silicon circuits are typically CMOS circuits used for digital signals and the column III-V circuits are for microwave, millimeter wave, and optical signals. Typically this integration is done by fabricating the silicon and column III-V circuits separately on different chips and then electrically connecting them, often with wire bonds. This process is expensive, limits integration complexity, increases the footprint, and introduces parasitic resistances and inductances which degrade circuit performance.

It is also known in the art that transistors have been formed on silicon having <100> and <111> crystallographic orientations (i.e., where, as is well known, a <100> crystallographic orientation is where the <100> axis of the crystalline silicon is normal (i.e., perpendicular) to the layer growing or depositing surface of the silicon and a <111> crystallographic orientation is where the <111> axis of the crystalline silicon is normal (i.e., perpendicular) to the layer growing or depositing surface of the silicon). Many years ago, CMOS was formed on silicon substrates having the <111> crystallographic orientation; however this orientation is inferior for CMOS compared to the <100> crystallographic orientation due to a higher surface state density on the <111> crystallographic orientation.

One CMOS structure is formed on a silicon-on-insulator (SOI) structure. This SOI structure includes a silicon substrate having a <100> crystallographic orientation. An insulating layer of SiO2 is formed on the silicon substrate. An upper device layer of silicon having a <100> crystallographic orientation is formed on the insulating layer, the insulating layer being used to assist electrical isolation of the CMOS transistor devices formed in the upper silicon layer. Thus, both the upper device layer and the substrate have the same crystallographic orientation (i.e., a <100> crystallographic orientation).

It is also known that it is desirable to have silicon CMOS transistors and column III-V (e.g. GaN, GaAs or InP) transistors on a common substrate. One structure used to form CMOS transistors and column III-V transistors on a common substrate is shown in FIG. 1. There, a GaAs transistor is formed on the same substrate as the CMOS transistors. It is also known that GaAs may be grown on a growth layer having a <100> crystallographic orientation It is also known in the art that a column III-V (such as a column III-N, for example, GaN, AlN, GaAlN, InGaN) device can be formed on a silicon substrate. Since it is preferable that the GaN device be formed with <111> crystallographic orientation to minimize crystal defects, the device is typically formed on a substrate (e.g., silicon) having a <111> crystallographic orientation. This device is shown in the middle portion of the structure shown in FIG. 1.

On Jul. 3, 2012, U.S. Pat. No. 8,212,294 was granted, entitled "Structure having silicon CMOS transistors with column III-V transistors on a common substrate", inventors Hoke et. al., assigned to the same assignee as the present patent application. As described therein, a starting wafer comprises a handle silicon substrate with a <111> orientation, a silicon dioxide insulating layer over a first portion of the <111> substrate, a silicon <100> layer disposed over the insulating layer, and a column III-V device having the same crystallographic orientation as the silicon layer disposed on the second portion of the silicon substrate. More particularly, the semiconductor structure includes a column III-As, column III-P, or column III-Sb device on the <100> silicon layer and is shown in FIG. 1. More particularly, CMOS transistors are formed on one portion of a <100> silicon layer and an MHEMT device, here an InP MHEMT device having column III-As layers, formed on anther portion of the <100> silicon layer. It is noted that the InP MHEMT is in contact with, and is grown along, the <100> crystallographic axis of the silicon layer.

The inventor has recognized that further improvements can be made to the structure described in the above referenced U.S. Pat. No. 8,212,294 (here shown in FIG. 1). More particularly, the inventor has recognized that:

1. The InP MHEMT is not nearly co-planar with the other device surfaces which complicates device processing.

2. The thermal resistance path for heat generated in the InP MHEMT to the substrate is increased by the presence of the silicon layer and SiO2 layer.

3. The growth of III-V material such as the InP MHEMT on a Si <100> surface is improved by tilting the Si<100> surface several degrees. The CMOS process, however, is developed on <100> silicon layers that are not misoriented. Tilting the silicon layer can alter the CMOS process by changing the depths of implanted species.

4. The growth of III-V material such as the MHEMT on a tilted <100> silicon surface is improved by performing a high temperature (~900 C) anneal to form bilayer steps in the surface. If bilayer steps are not formed, the growth of a binary III-V material on <100> elemental silicon results in antiphase boundary defects. A high temperature anneal could degrade the CMOS and possibly the GaN HEMT present on the wafer.

Having recognized these effects, the inventor discloses herein a non-nitride column III-V or column II-VI device structure, CdTe, HgCdTe or ZnO devices grown on a third portion of a silicon substrate instead of on the silicon <100> layer disposed over the insulating layer.

In one embodiment, a semiconductor structure is provided having: a silicon substrate having a <111> crystallographic orientation; an insulating layer disposed over a first portion of the silicon substrate; a silicon layer having a <100> orientation disposed over the insulating layer, a non-nitride column III-V or column II-VI semiconductor layer having the same <111> crystallographic orientation as the silicon substrate, the non-nitride column III-V or column II-VI semiconductor layer being in direct contact with a second portion of the silicon substrate, the non-nitride column III-V or column II-VI semiconductor layer having formed therein an active device.

In one embodiment, the non-nitride device is a column III-X device, where X is a non-nitride element.

In one embodiment, the column II-VI semiconductor layer is CdTe, HgCdTe or ZnO.

In one embodiment, the column III-X device is a column III-As, column III-P, or column III-Sb device or column III alloys of As, P, and Sb.

In one embodiment, the column III-X device is a InP device

In one embodiment, a III-N layer is in direct contact with a third portion of the substrate, where N is nitrogen.

In one embodiment, the silicon layer has active devices fabricated in it such as CMOS transistor devices formed therein.

With such a structure:

1. The surfaces of the 3 device types, silicon CMOS, GaN HEMT, and InP MHEMT are nearly coplanar.

2. The InP MHEMT is grown directly on the silicon substrate resulting in reduced thermal resistance.

3. The growth of the MHEMT on the substrate eliminates any the need to tilt to the CMOS silicon layer.

4. The steps in a <111> surface are naturally bilayer so the high temperature bilayer anneal is eliminated.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
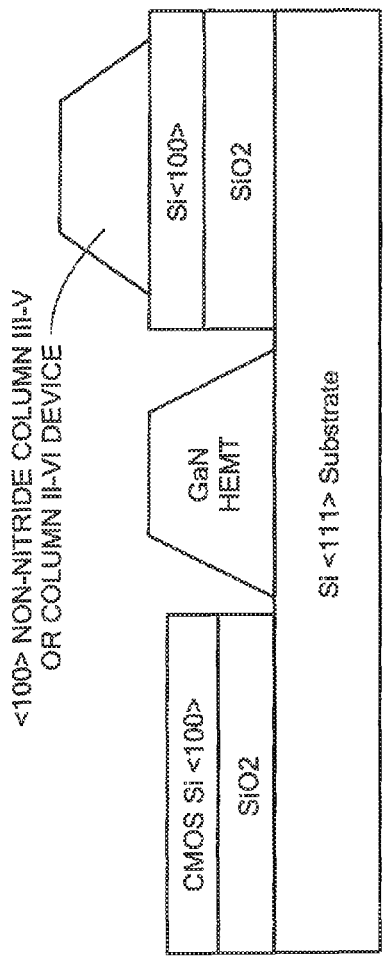
FIG. 1 is a simplified cross sectional diagram of a semiconductor structure according to the PRIOR ART.
Figure 2:
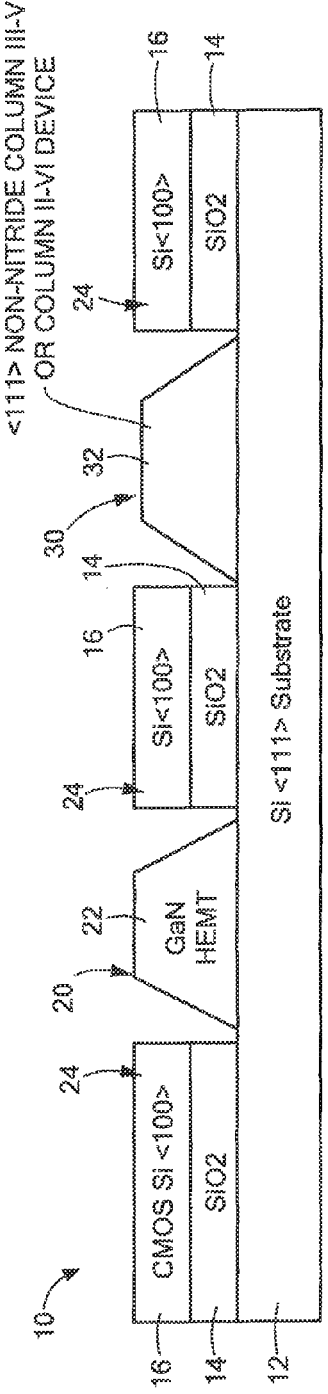
FIG. 2 is a simplified cross sectional diagram of a semiconductor structure according to the disclosure.

Referring now to FIG. 2, a semiconductor structure 10 is shown having: a silicon substrate 12 having a <111> crystallographic orientation; an insulating layer, 14, here silicon dioxide, disposed over a first portion of the silicon substrate 12; and a silicon layer 16 having a <100> orientation disposed over the insulating layer 14, here silicon dioxide. Such structure to this point may be formed using any conventional process such as that described in the above referenced U.S. Pat. No. 8,212,294.

Next, CMOS transistor devices 24 are formed in the silicon layer 16 over a first portion of substrate 12.

Next, a mask, not shown, is used to mask the formed CMOS transistor devices 24 for protection and a window in the mask is used to etch an opening 20 through the silicon layer 16 and the silicon dioxide layer 14 down to expose a second portion of the silicon substrate 12.

Next, a GaN transistor device 22 is formed on the exposed second portion of the silicon substrate 12, as shown.

Next, a mask not shown is used to protect the CMOS transistor devices 24 and the GaN device 22.

Next, a window in the mask is used to form an opening 30 through the exposed portion of the silicon layer 16 and underlying portion of the silicon dioxide layer 14 to expose a third portion of the silicon substrate 12. Next, a non-nitride device 32 is formed on the exposed third portion of the silicon substrate 12, as shown. More particularly, the non-nitride device 32 is: (a) a column III-X device, where X is a non-nitride element, for example, the column III-X device is a column III-As, column III-P, column III-Sb device, or alloys of As, P, and Sb; here an InP device, Other column III-X devices are possible such as the GaAs HEMT, InP HBT, GaInAs quantum well detector or laser, or InAsSb infrared detector. On the third portion of the silicon substrate column II-VI devices such as CdTe-based solar cells, HgCdTe infrared detectors, or zinc oxide transparent conductors can also be formed.

A number of embodiments of the disclosure have been described. Nevertheless, it will be understood that various modifications may be made without departing from the spirit and scope of the disclosure. For example, silicon circuits other than CMOS may be fabricated in the silicon layer, 16. Also the III-X layer 32 may contain two device structures grown in the layer stack. Accordingly, other embodiments are within the scope of the following claims.

What is claimed is:

1. A semiconductor structure comprising:
    a silicon substrate having a <111> crystallographic orientation;
    an insulating layer disposed over a first portion of the silicon substrate;
    a silicon layer having a <100> orientation disposed over the insulating layer,
    a non-nitride column III-V semiconductor layer or column II-VI semiconductor layer having the same <111> crystallographic orientation as the silicon substrate, the non-nitride column III-V semiconductor layer or the column II-VI semiconductor layer being in a direct contact with a second portion of the silicon substrate.

2. The semiconductor structure recited in claim 1 where the non-nitride device is a column III-X device, where X is a non-nitride element.

3. The semiconductor device recite in claim 2 wherein the column III-X device is a column III-As, column III-P, column III-Sb, or column III alloys of As, P, Sb device.

4. The semiconductor structure recited in claim 1 including a III-N layer in direct contact with a third portion of the substrate, where N is nitrogen.

5. The semiconductor structure recited in claim 2 including a III-N layer in direct contact with a third portion of the substrate, where N is nitrogen.

6. The semiconductor structure recited in claim 3 including a III-N layer in direct contact with a third portion of the substrate, where N is nitrogen.

7. A semiconductor structure comprising:
    a silicon substrate having a <111> crystallographic orientation;
    an insulating layer disposed over a first portion of the silicon substrate;
    a silicon layer having a <100> orientation disposed over the insulating layer,
    a non-nitride column III-V semiconductor layer or column II-VI semiconductor layer having the same <111> crystallographic orientation as the silicon substrate, the non-nitride column III-V semiconductor layer or the column II-VI semiconductor layer being in direct contact with a second portion of the silicon substrate, the column III-V semiconductor layer being column III-As, column III-P, column III-Sb, or column III alloys of As, P, Sb device and the column II-VI semiconductor being a column II-O, column II-S, column II-Se, column II-Te or column II alloys of O, S, Se, and Te.

8. The semiconductor structure recited in claim 7 including a III-N layer in direct contact with a third portion of the substrate, where N is nitrogen.

9. The semiconductor structure recited in claim 7 wherein the silicon layer has a transistor device formed therein.

10. The semiconductor structure recited in claim 9 wherein the silicon layer has CMOS transistor devices formed therein.

11. The semiconductor structure recited in claim 10 wherein the column III-V semiconductor layer having formed therein an InP or GaAs or InSb device.

12. The semiconductor structure recited in claim 1 wherein the column III-V semiconductor layer has formed therein a InP or GaAs or InSb device.

13. The semiconductor structure recited in claim 1 wherein the column II-VI semiconductor layer is CdTe, HgCdTe or ZnO.

14. The semiconductor structure recited in claim 10 wherein the column II-VI semiconductor layer is CdTe, HgCdTe or ZnO.

\* \* \* \* \*